(12) United States Patent
Srivastava et al.

(10) Patent No.: US 12,164,003 B2
(45) Date of Patent: Dec. 10, 2024

(54) METHOD OF DETERMINING THE REMAINING LIFE OF MAIN CONTACTS IN AN AUTOMATIC TRANSFER SWITCH USING THERMAL PROFILING

(71) Applicant: EATON INTELLIGENT POWER LIMITED, Dublin (IE)

(72) Inventors: Jagdambika Srivastava, Gonda (IN); Yashwant Gangadhar Gaikwad, Pune (IN); Amit Govind Kolge, Pune (IN); Ramya Jayanthi, Pune (IN); Joshua David Myers, Hendersonville, NC (US); Mark A. Gould, Hendersonville, NC (US); Charlie E. Hume, Asheville, NC (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 165 days.

(21) Appl. No.: 17/951,302

(22) Filed: Sep. 23, 2022

(65) Prior Publication Data
US 2024/0103081 A1    Mar. 28, 2024

(51) Int. Cl.
*G01R 31/327* (2006.01)
*H02J 9/06* (2006.01)

(52) U.S. Cl.
CPC ............ *G01R 31/3274* (2013.01); *H02J 9/06* (2013.01)

(58) Field of Classification Search
CPC ............................... G01R 31/3274; H02J 9/06
See application file for complete search history.

(56) References Cited

U.S. PATENT DOCUMENTS

| | | | |
|---|---|---|---|
| 2017/0117747 A1* | 4/2017 | Zhou | H01H 1/22 |
| 2022/0226171 A1* | 7/2022 | Guse, III | A61B 6/56 |
| 2022/0328273 A1* | 10/2022 | Vaghasiya | H02J 13/00004 |
| 2022/0336171 A1* | 10/2022 | Jin | G01N 9/26 |
| 2023/0251606 A1* | 8/2023 | Nair | G05B 17/02 |
| | | | 700/28 |

\* cited by examiner

*Primary Examiner* — Christopher P McAndrew
*Assistant Examiner* — Zannatul Ferdous
(74) *Attorney, Agent, or Firm* — Eckert Seamans Cherin & Mellott, LLC (57) ABSTRACT

A method of monitoring main contact conditions of main contacts in an automatic transfer switch is provided. The automatic transfer switch is coupled to a plurality of electrical power sources and an electrical load. The method includes: measuring, by sensors, temperatures of a plurality of main contacts coupled to the plurality of power sources; determining if the measured temperatures indicate a temperature rise at one or more main contacts of the plurality of main contacts; in response to determining that the measured temperatures indicate a temperature rise at the one or more main contacts, comparing a current value of the temperature rise with stored temperature rise values that represent main contact damages; and determining an amount of main contact damage at the one or more main contacts based on the comparison.

19 Claims, 4 Drawing Sheets

METHOD OF DETERMINING THE REMAINING LIFE OF MAIN CONTACTS IN AN AUTOMATIC TRANSFER SWITCH USING THERMAL PROFILING

FIELD OF THE INVENTION

The disclosed concept relates generally to a method of monitoring electrical contact conditions in an electrical network, and in particular a method of determining the remaining life of main contacts in an automatic transfer switch using thermal profiling of the main contacts.

BACKGROUND OF THE INVENTION

An automatic transfer switch (ATS) is a device used to provide continuous power supply to an electrical load and protect the load against loss of power (e.g., power outage, decrease in power below a required amount, etc.). As such, an automatic transfer switch is responsible for a reliable transition of an electric load between two or more power sources (e.g., utility, diesel generator, renewable energy resource, etc.). Upon a primary or normal power source failure (e.g., utility), an automatic transfer switch transfers the electrical load connection from the primary power source to a secondary or alternate power source (e.g., a generator) and supplies power from the secondary power source to the load. When the primary power source is restored, the electrical load connection is transferred back to the primary power source from the alternate power source via a power switching mechanism of the automatic transfer switch. The main electrical current carrying component(s) of an automatic transfer switch are the main contacts housed within the power switching mechanism (e.g., contactor, circuit breaker or other switching device type). The main contacts of the power switching mechanism may suffer damage or wear out during the course of their operational life. For example, operation of the power switching mechanisms cause the main contacts to open and/or close. Opening the main contacts breaks the flow of electrical current, and closing the main contacts allows the electrical current to flow. This opening and closing action may lead to deterioration of the main contacts over a period of time. For example, hotspots (e.g., voids, gaps, etc.) may be created at specific locations on the main contact surface. Undetected deterioration of the main contacts of the power switching mechanism may result in equipment failures, operational losses, and/or safety hazards.

Conventionally, a service engineer assesses viability of the automatic transfer switch, particularly the main contacts, during routine maintenance or inspection scheduled at predetermined time intervals, e.g., monthly, quarterly, annually, etc. A viability assessment is most commonly achieved by making an electrical resistance measurement of the main contacts. The conventional approach requires injecting a predetermined amount of electrical current through each set of main contacts and measuring the related voltage drop with a measurement device (e.g., a digital low resistance ohm meter, etc.). The electrical resistance can then be calculated, which is often performed by the measurement device itself. However, a significant amount of planning, resources, and operational downtime may be required to assess and determine the condition of the main contacts with time-based (i.e., regularly scheduled) maintenance or inspection. For example, external equipment (e.g. external sensors or meters) may be required to make electrical measurements. Some disassembly of the automatic transfer switch may be needed to access the main contacts. De-energization of the power switching mechanism of the automatic transfer switch may be required to safely access the main contacts. In addition, the voltage drop method used to calculate the electrical resistance can be heavily influenced by transient surface conditions at the main contacts and should not be used alone to determine main contact viability. As such, the conventional maintenance or inspection of the main contacts faces numerous drawbacks despite the fact that the risk of a significant main contact damage may be limited since the automatic transfer switch may only perform a few switching operations per year.

There is considerable room for improvement in a power switching mechanism to detect main contact conditions in an automatic transfer switch.

There is a room for improvement in determining the remaining life of the main contact of a power switching mechanism in an automatic transfer switch.

SUMMARY OF THE INVENTION

These needs, and others, are met by embodiments of the disclosed concept in which a method of monitoring the conditions of main contacts in an automatic transfer switch is provided. The automatic transfer switch is coupled to a plurality of electrical power sources and an electrical load. The method includes: measuring, by sensors, temperatures of a plurality of main contacts coupled to the plurality of power sources; determining if the measured temperatures indicate a temperature rise at one or more main contacts of the plurality of main contacts; in response to determining that the measured temperatures indicate a temperature rise at the one or more main contacts, comparing a current value of the temperature rise with stored temperature rise values that represent main contact damage; and determining an amount of main contact damage at the one or more main contacts based on the comparison.

Another embodiment provides a method of temperature rise values for determining main contact conditions and remaining life of main contacts of a power switching mechanism in an automatic transfer switch coupled to a plurality of electrical power sources and an electrical load. The method includes: performing switching operations of the automatic transfer switch; measuring changes in main contact thickness of the main contacts of the power switching mechanism, the changes in main contact thickness indicative of main contact damage of the main contacts as a result of the switching operations; generating a relation between the temperature rises and the measured changes in main contact thickness of the main contacts; and deriving temperature rise values that represent respective amounts of main contact thickness degradation based on the generated relation.

BRIEF DESCRIPTION OF THE DRAWINGS

A full understanding of the invention can be gained from the following description of the preferred embodiments when read in conjunction with the accompanying drawings in which.

DETAILED DESCRIPTION OF THE INVENTION

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

Some example embodiments of the disclosed concept, which will be described in more detail herein, provide methods to determine real-time main contact conditions and remaining life of one or more main contacts of a power switching mechanism of an automatic transfer switch (ATS) based on a value of temperature rise detected at a main contact surface of a main contact and a relation between a temperatures rise at the main contact surface and main contact damage of the main contact. The relation indicates that a temperature rise at a main contact surface of a main contact is a function of an amount of main contact damage of the main contact. The main contact damage may be characterized by a change in main contact thickness of the main contact, particularly a decrease in main contact thickness (e.g., a percentage of decrease as compared to the main contact thickness at zero damage). In an example embodiment in accordance with the present disclosure, a non-contact infrared temperature sensor measures real-time temperatures at main contacts of a power switching mechanism during the operation of an ATS coupled to a plurality of power sources and an electrical load. The non-contact type IR sensor is disposed (e.g., without limitation, fixed) in close proximity and pointing to the main contact surface without touching the main contact, and thus, is not damaged by the high temperature of the main contact during switching operations of the power switching mechanism. Furthermore, since the temperature measured by the non-contact type IR sensor is directly used to determine the main contact condition and remaining life of the main contacts, accuracy of such determination is high.

Based on the temperature measured by the non contact type IR sensor, the control logic (controller) of the ATS determines whether temperature has risen at one or more main contacts as compared to the temperature measured at zero main contact damage. If the temperature has risen at one or more main contacts, the controller compares a value of temperature rise at a main contact location (e.g., input side coupled to a primary power source, a secondary power source, or other alternate power sources, if any) to temperature rise values that represent main contact damage based on collected data. The collected data include a temperature measured at zero main contact damage, to 100% main contact damage. The controller then establishes the relation between the temperature rise values and main contact damage amounts. For example, where a zero contact damage represents a zero degradation of main contact thickness and the temperature measured at zero degradation is 30° C., the collected data may show that a temperature rise value of 20° C. corresponds to a 10% decrease in main contact thickness, and so forth.

Based on a simple comparison of the current value of the temperature rise to the temperature rise values that represent main contact damages at the predetermined intervals, the controller determines real-time the current main contact condition and remaining life of the one or more main contacts. In this example, the controller determines that if the current value of the temperature rise $\Delta T$ at a main contact location is 20° C., then the controller determines that the amount of the contact damage at that contact location is 10% and the remaining life of the main contact is 90%. When the remaining life of the one or more main contacts has reached a replacement level requiring the replacement of the one or more main contacts, the controller may alert the service engineer that the remaining life of the one or more main contacts has reached the replacement level. Upon receipt of such alert, the service engineer may replace the power switching mechanism within the ATS. Alternatively, the service engineer may replace the one or more main contacts whose remaining life has reached the replacement level without having to replace the entire power switching mechanism This real-time temperature measurement, comparison of the temperature rise to the collected data and determination of main contact damage and remaining life of the contacts based on the comparison allow the service engineer to monitor the current contact condition in real-time and predict impending failure of the contacts at specific locations. Further, the present disclosure allows the service engineer to transition from the conventional time-based maintenance to a proactive condition-based maintenance approach that eliminates unnecessary requirements for physical inspection of the main contacts during each maintenance visit (even when the contacts are in good condition). This reduces inspection time, efforts and costs of maintenance and provides a realistic assessment of contactor state/condition with a reasonably high-level accuracy as needed.

Figure 1:
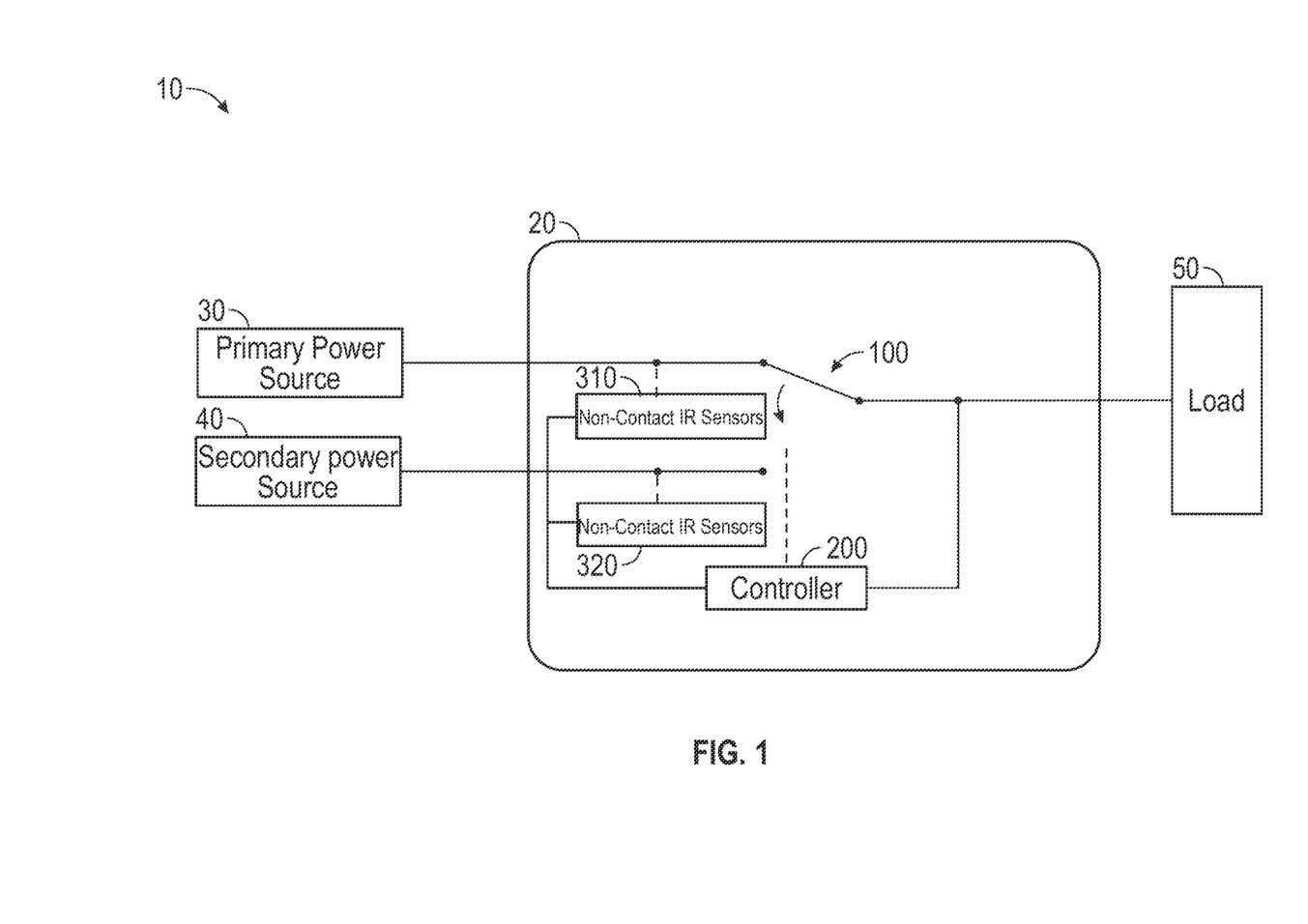
FIG. 1 is a diagram of a power system in accordance with an example embodiment of the disclosed concept.
Figure 2:
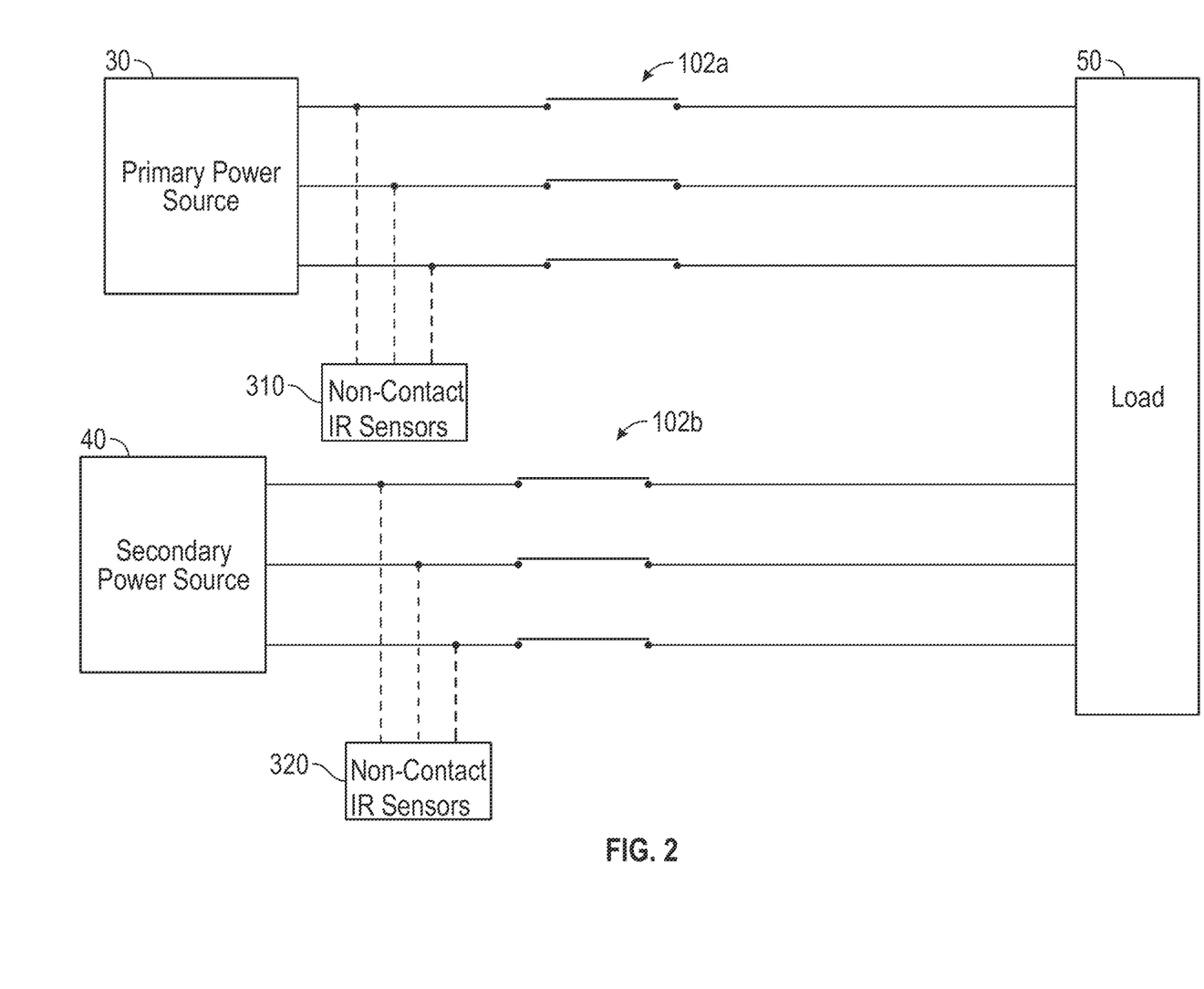
FIG. 2 is a diagram of temperature measurement locations in accordance with an example embodiment of the disclosed concept.

FIG. 1 is a diagram of a power distribution system 10 in accordance with an example embodiment of the disclosed concept. The power distribution system 10 includes an automatic transfer switch (ATS) 20, a primary power source 30, a secondary power source 40, and a common load 50. The primary power source 30 may be, for example and without limitation, a utility power supply and provides power to the common load 50 during normal operation. The secondary power source 40 may be a backup, emergency power supply, for example and without limitation, a generator, a transformer, etc., and provides power to the common load 50 during utility power outage. However, it will be appreciated that a utility power supply and a backup power supply are provided as an example, other arrangements and types of power sources may be employed without departing from the scope of the disclosed concept. While FIG. 1 shows two power sources 30,40, there may be more than two power sources as appropriate without departing from the scope of the disclosed concept. Additionally, while a single phase of power flowing through the ATS 20 is shown for simplicity of illustration, it will be appreciated that the ATS 20 may accommodate multiple phases of power, such as 3-phase power as shown in FIG. 2.

The ATS 20 includes a power switching mechanism 100 operable to selectively switch between providing the common load 50 with power from the primary power source 30 to providing the common load 50 with power from the secondary power source 40, and vice versa. The power switching mechanism 100 may be composed, for example, of one or more contactors 102*a,b* (FIG. 2). The ATS 20 also includes a controller 200 structured to control operation of the power switching mechanism 100. As a result of repeated switching, components in the power switching mechanism 100 or elsewhere in the ATS 20 may experience contact wear or loose joints. For example, contacts (main contacts) of the power switching mechanism 100 in the ATS 20 may experience main contact damage characterized by a change in main contact thickness, pit formation or decrease in silver content in the contacts, creating hotspots at different locations leading to a temperature rise based on an amount of main contact thickness degradation (e.g., an amount of decrease in main contact thickness, etc.).

Non-contact type sensors, e.g., without limitation, non-contact type infrared (IR) temperature sensors, 310, 320 are structured to monitor and detect the amount of temperature rise, if any, at the main contact surface. Contact surface damage or degradation may be characterized by a change in main contact thickness or formation of pits on main contact surface of the one or more main contacts. The change in main contact thickness or pit formation may create a hotspot or gap at different contact surfaces leading to a temperature rise based on the amount of the main contact surface degradation. That is, the hot spot or gap increases electrical resistance of the main contact surface when the current flows. The increased electrical resistance increases heat (i.e., $I^2R$ loss) generated at that location. The $I^2R$ loss causes a rise in temperature at the damaged main contact surface. As such, the temperature rise at a main contact location (e.g., input side coupled to a primary power source 30, a secondary power source 40, or other alternate power sources, if any)) is a function of a contact damage:

$$\text{Temperature rise at contact location} = f(\text{contact damage}) \qquad \text{EQ. 1}$$

The conventional approach uses different types of sensors to determine the contact or join wear and tear, but does not use the non-contact type IR temperature sensors 310,320. However, because the temperature of the main contacts are very high, any type of contact temperature sensor may melt at that location, becoming useless. In example embodiments of the disclosed concept, the non-contact type IR temperature sensors 310, 320 are utilized to measure the main contact temperature based on the emitted IR waves of the main contacts without touching them with high precision, high resolution and a fast response.

In example embodiments of the disclosed concept, the controller 200 is structured to obtain temperatures measured by the non-contact type IR temperature sensor 310,320 at the contacts (main contacts) of the power switching mechanism 100 of the ATS 20. Based on the temperatures measured by the non contact type IR sensor, the controller 200 is structured to determine real-time whether temperatures has risen at one or more main contacts as compared to temperature measured at zero main contact damage. If the temperature has risen at one or more main contacts, the controller 200 is structured to compare real-time a current value of temperature rise at a main contact location (e.g., input side coupled to a primary power source, a secondary power source, or other alternate power sources, if any) to temperature rise values that represent main contact damages based on collected data during testing. The collected data are obtained during a training (collection) stage using a test device (i.e., a test power switching mechanism with main contacts having the same specifications and dispositions as an in-service power switching mechanism 100 with its main contacts 102*a,b*) and transferred to in-service devices (e.g., a memory of the controller 200) for use. The collected data include a temperature measured at zero contact damage, to 100% main contact damage, The controller 200 then establishes the relation between the temperature rise values and main contact damage amounts.

The relation between the temperature rise values and the main contact damage amount is derived during the training (data collecting) phase using the test device (i.e., the test power switching mechanism with main contacts having the same specifications and dispositions as an in-service power switching mechanism 100 with its main contacts 102*a,b*) and transferred to in-service devices (e.g., a memory of the controller 200) for use, as follows: First, a service engineer measures the main contact thickness at zero damage (e.g., 0% decrease in main contact thickness) and obtains the temperature measured by the non contact type IR sensors 310,320 at the main contacts with zero damage. If, for example, the temperature measured at zero contact damage is 30° C., then temperature rise value equals zero (ΔT=0) for zero contact damage. Next, a test is performed, during which the ATS 20 operates (i.e., the power switching mechanism 100 switches from the primary power source 30 to the secondary power source 40 and back to the primary power source 30) until the main contacts are damaged by, e.g., without limitation, 10% (e.g., a 10% decrease in main contact thickness from the main contact thickness at zero damage), and a temperature rise value ΔT at the 10% main contact damage interval at rated current is obtained. For example, if the temperature measured at that interval is, e.g., without limitation, 50° C., then the temperature rise value at 10% main contact damage is 20° C. (50° C.–30° C.). Similarly, during next test, the ATS 20 performs the switching operation such that the total main contact damage is, e.g., without limitation, 20% (e.g., 20% decrease in main contact thickness), and obtains the temperature measured at the 20% main contact damage interval. If, for example, the temperature measured is 55° C., the temperature rise value is 25° C. at the 20% main contact damage interval. Likewise, another test is performed, during which the ATS 20 performs the switching operations such that the total main contact damage is, e.g., without limitation, 30% and obtains the temperature measured at the 30% main contact damage interval. If, for example, the temperature measured is 62° C., the temperature rise value at this interval is 32° C. This process is repeated this process until the main contacts are fully damaged. And the collected data may be transferred to the in-service devices.

Upon completion of the process, the controller 200 generates the relation between the temperature rise values and the change in main contact damage (e.g., the percentage of changes (decreases) in main contact thickness). In some examples, the controller 200 may plot the collected data and obtain a trend between the temperature rise values and the main contact damage level, and find the relation based on the trend. The incremental 10% main contact damage is for illustrative purposes only, and thus, can be any other increments (uniform or varying) of main contact damage may be used as preferred or depending on the circumstances. Further, the temperature rises provided in the 10% incremental main contact damage is for illustrative purposes only, and the actual temperature rises may differ from the above example.

The controller 200 is structured to derive temperature rise values that represent main contact thickness damages based on the generated relation. Using the above example, if the non-contact type IR temperature sensors 310, 320 detects 20° C. as a current value of the temperature rise at a main contact location, the main contact at issue has suffered a 10% main contact damage, and thus have 90% remaining life. When the remaining life of the one or more main contacts has reached a replacement level requiring the replacement of the one or more main contacts, the controller 200 may alert the service engineer that the remaining life of the one or more main contacts has reached the replacement level. The replacement level may be set according to, e.g., the type of the power sources, load requirements of the common load 50, user preferences, safety requirements, etc. For example, the user may set the replacement level to be when the remaining life of the one or more main contacts has reached 30% or less. Upon receipt of such alert, the service engineer may replace the power switching mechanism 100 within the ATS 20. Alternatively, the service engineer may replace the one or more main contacts whose remaining life has reached the replacement level without having to replace the entire power switching mechanism 100.

The controller 200 may include a processor and a memory. The processor may be, for example and without limitation, a microprocessor, a microcontroller, or some other suitable processing device or circuitry, that interfaces with the memory. The memory can be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory.

FIG. 2 illustrates an example of temperature sensing locations of main contacts in in the ATS 20 of FIG. 1. In FIG. 2, the primary and secondary power sources 30, 40 are 3-phase power sources structured to be coupled to a power switching mechanism (e.g., contactors 102*a,b*) that connect or disconnect power from the 3-phase power inputs. Non-contact type IR temperature sensors 310 measure temperatures of main contacts of the contactor 102*a* at each of the 3 phase input side, the contactor 102*a* structured to be coupled to the primary power source 30 and the load 50 during normal operation. Non-contact type IR temperatures sensors 320 measure temperatures at main contacts of the contactor 102*b* at each of the 3 phase input sides, the contactor 102*b* structured to be coupled to the secondary power source 40 and the load 50 when the primary power source 30 fails.

Figure 3:
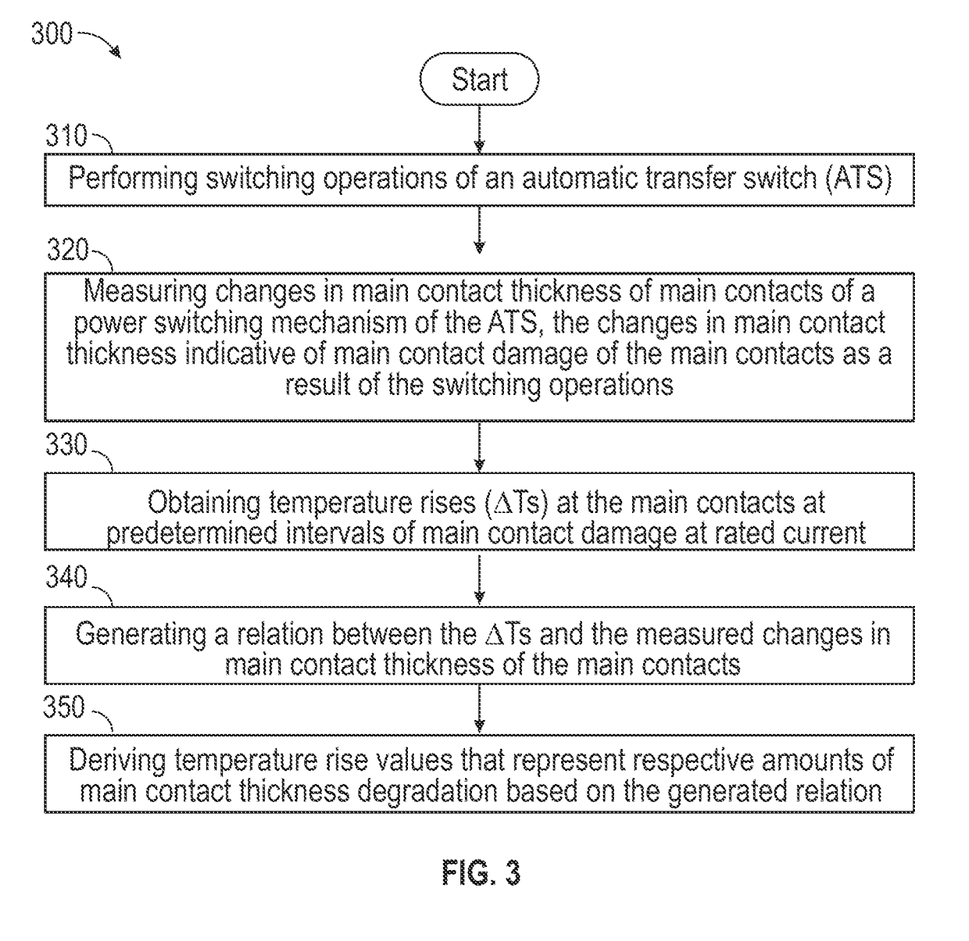
FIG. 3 is a flow chart for a method of establishing temperature value rises that represent contact damage in accordance with an example embodiment of the disclosed concept.

FIG. 3 is a flow chart of a method 300 of establishing a relation between a temperature rise value and main contact thickness damage during a data collection/training phase according to an example embodiment of the disclosed concept. The method 300 will be performed during engineering design phase, the controller 200 or other components of the automatic transfer switch 20 as described with reference to FIG. 1. The data collection/training phase is one-time engineering activity performed using a test device (i.e., a test power switching mechanism with main contacts having the same specifications and dispositions as an in-service power switching mechanism 100 with its main contacts 102*a,b*) and the data collected are transferred to in-service devices (e.g., to a memory within the controller 200 of the automatic transfer switch 20) for use.

At 310, an automatic transfer switch performs switching operations. The switching operations will induce main contact damage represented as, e.g., changes in main contact thickness. The switching operations include opening and closing of the main contacts.

At 320, a user (e.g., a service engineer) measures a change in main contact thickness of main contacts of the power switching mechanism 100.

At 330, the controller 200 obtains temperature rises (ATs) at the main contacts of the power switching mechanism 100 at predetermined intervals of main contact damage at rated current.

At 340, the controller 200 generates a relation between an amount of the temperature rise and the measured changes in main contact thickness of the main contacts. The generated relation may be stored in a memory in the controller 200.

At 350, the controller 200 derives temperature rise values that represent main contact thickness degradation based on the generated relation.

Figure 4:
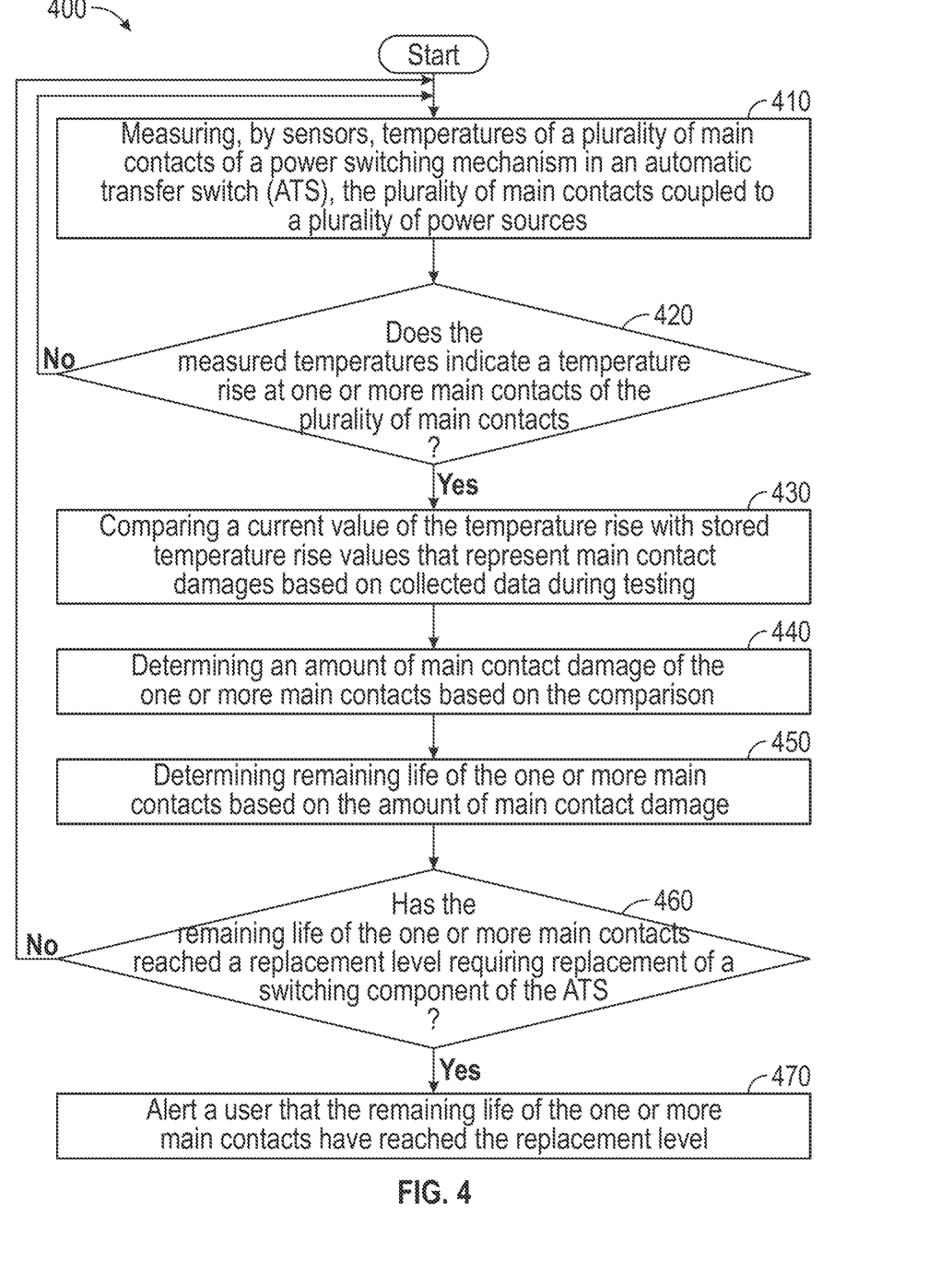
FIG. 4 is a flow chart for a method of real-time monitoring main contact conditions and determining remaining life of main contacts of an automatic transfer switch in accordance with an example embodiment of the disclosed concept.

FIG. 4 is a flow chart of a method 400 for monitoring and determining main contact thickness damage in an ATS according to an example embodiment of the disclosed concept. The method 400 may be performed real-time by the controller 200 or other components of the automatic transfer switch 20 in FIG. 1.

At 410, non-contact type infrared temperature sensors 310, 320 measure temperatures of a plurality of main contacts of a power switching mechanism 100 in the ATS 20, the plurality of main contact coupled to a plurality of power sources.

At 420, the controller 200 determines whether the measured temperatures indicate a temperature rise at one or more main contacts of the plurality of main contacts. If no, the method 400 returns to 410. If yes, the method 400 proceeds to 430.

At 430, the controller 200 compares a current value of the temperature rise with stored temperature rise values that represent main contact damages based on collected data during testing.

At 440, the controller 200 determines an amount of main contact damage of the one or more main contacts based on the comparison.

At 450, the controller 200 determines remaining life of the one or more main contacts based on the amount of main contact damage.

At 460, the controller 200 determines whether the remaining life of the one or more main contacts has reached a replacement level requiring replacement of a switching component of the ATS. If no, the method 400 returns to 410. If yes, the method 400 proceeds to 470.

At 470, the controller 200 alerts a user that the remaining life of the one or more main contacts has reached the replacement level. Upon receiving the alert, the user may replace the power switching mechanism or the one or more damaged main contacts of the power switching mechanism 100.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of disclosed concept which is to be given the full breadth of the claims appended and any and all equivalents thereof.

What is claimed is:

1. A method of monitoring main contact conditions of main contacts in an automatic transfer switch coupled to a plurality of power sources and an electrical load, comprising:

measuring, by sensors, temperatures of a plurality of main contacts coupled to a plurality of power sources;

determining if the measured temperatures indicate a temperature rise at one or more main contacts of the plurality of main contacts;

in response to determining that the measured temperatures indicate a temperature rise at the one or more main contacts, comparing a current value of the temperature rise with collected data including stored temperature rise values that represent main contact damages, wherein the collected data include temperatures measured by the sensors during testing at predetermined intervals of main contact damage, the predetermined intervals comprising incremental intervals of main contact damage, each incremental interval indicative of an amount of main contact thickness degradation of main contacts having the same specifications of the plurality of main contacts and disposed at respective main contact locations; and determining an amount of main contact damage at the one or more main contacts based on the comparison.

2. The method of claim 1, further comprising:

determining remaining life of the one or more main contacts based on the amount of main contact damage.

3. The method of claim 1, wherein the sensors comprise non-contact type infrared temperature sensors.

4. The method of claim 3, wherein the value of the temperature rise is associated with an increase in heat generated on main contact surface at a main contact location as a result of switching of a power switch mechanism of the ATS among the plurality of power sources.

5. The method of claim 4, wherein the heat is increased based on an increased resistance as a result of a hot spot created on the main contact surface at the time of the switching.

6. The method of claim 2, further comprising:

determining if the remaining life of the one or more main contacts has reached a replacement level requiring replacement of a switching component of an automatic transfer switch.

7. The method of claim 6, further comprising;

in response to determining that the remaining life of the one or more main contacts has reached the replacement level, alerting a user that the remaining life of the one or more main contacts has reached the replacement level.

8. The method of claim 7, further comprising:

replacing the switching component of the automatic transfer switch based on the alerting.

9. The method of claim 8, wherein replacing the switching component of the automatic transfer switch comprises:

replacing a power switching mechanism of the automatic transfer switch; or replacing the one or more main contacts that have reached the replacement level.

10. The method of claim 1, wherein the amount of main contact thickness degradation is indicated by a percentage of decrease in main contact thickness.

11. A method of monitoring main contact conditions of main contacts in an automatic transfer switch coupled to a plurality of power sources and an electrical load, comprising:

measuring, by sensors, temperatures of a plurality of main contacts coupled to a plurality of power sources;

determining if the measured temperatures indicate a temperature rise at one or more main contacts of the plurality of main contacts;

in response to determining that the measured temperatures indicate a temperature rise at the one or more main contacts, comparing a current value of the temperature rise with collected data including stored temperature rise values that represent main contact damages, wherein the collected data include temperatures measured by the sensors during testing at predetermined intervals of main contact damage, the predetermined intervals comprising incremental intervals of main contact damage, each incremental interval indicative of an amount of main contact thickness degradation of main contacts having the same specifications of the plurality of main contacts and disposed at respective main contact locations; wherein during testing a relation is established between a temperature rise at a main contact location and an amount of main contact damage at the main contact location; and determining an amount of main contact damage at the one or more main contacts based on the comparison.

12. The method of claim 11, wherein the temperature rise at the main contact location is a function of the amount of main contact damage at the main contact location.

13. A method of establishing temperature rise values for determining main contact conditions and remaining life of main contacts of a power switching mechanism in an automatic transfer switch coupled to a plurality of power sources and an electrical load, comprising:

performing switching operations of the automatic transfer switch;

measuring changes in main contact thickness of the main contacts of the power switching mechanism, the changes in main contact thickness indicative of main contact damage of the main contacts as a result of the switching operations;

obtaining temperature rises at the main contacts at predetermined intervals of main contact damage at rated current;

generating a relation between the temperature rises and the measured main changes in contact thickness of the main contacts; and deriving temperature rise values that represent respective amounts of main contact thickness degradation based on the generated relation.

14. The method of claim 13, wherein temperature rise values are associated with respective increases in heat generated on main contact surface as a result of the switching operations.

15. The method of claim 13, wherein the increases in heat are based on increases in resistance caused by a hot spot created on the main contact surface at the time of the switching operations.

16. The method of claim 13, wherein the relation indicates that the temperature rises at a main contact location is a function of the main contact damage at the main contact location.

17. The method of claim 16, wherein the predetermined intervals of main contact damage comprises incremental intervals of main contact damage, each incremental interval indicative of an amount of main contact thickness degradation, the amount of main contact thickness indicated by a percentage of decrease in main contact thickness at the main contact location.

18. The method of claim 17, wherein the temperature rise values represent corresponsive percentages of decrease in the main contact thickness.

19. The method of claim 13, wherein deriving temperature rise values comprises:

generating a trend between the temperature rise values and the measured changes in main contact damages; and obtaining threshold temperature values based on plotting of the trend.

\* \* \* \* \*